United States Patent [19]
Theus

[11] Patent Number: 5,047,727
[45] Date of Patent: Sep. 10, 1991

[54] OFFSET-VOLTAGE-BALANCING OPERATIONAL AMPLIFIER

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 583,267

[22] Filed: Sep. 14, 1990

[30] Foreign Application Priority Data

Sep. 20, 1989 [EP] European Pat. Off. ........... 89117361

[51] Int. Cl.$^5$ .......................... H03F 1/02; H03F 3/16
[52] U.S. Cl. ........................................ 330/9; 330/261; 330/51; 307/353; 307/491; 307/494
[58] Field of Search ...................... 330/9, 261, 149, 51; 307/353, 491, 494

[56] References Cited

U.S. PATENT DOCUMENTS

| | | | |
|---|---|---|---|
| 4,365,204 | 12/1982 | Haque | 330/9 |
| 4,829,263 | 5/1989 | Gulczynski | 330/9 |
| 4,833,345 | 5/1989 | Miller | 307/491 |

FOREIGN PATENT DOCUMENTS

| | | | |
|---|---|---|---|
| 0161215 | 11/1987 | European Pat. Off. | |
| 3541948 | 6/1987 | Fed. Rep. of Germany | 330/9 |
| 2100087 | 12/1982 | United Kingdom | |
| 2210744 | 6/1989 | United Kingdom | 330/9 |

OTHER PUBLICATIONS

T. A. Schwarz, "Offset Compensation Circuit," IBM Technical Disclosure Bulletin, vol. 19, No. 9, Feb. 1977, pp. 3584-3585.

Michael Armstrong et al., "A CMOS Programmable Self-Calibrating 13b Eight Channel Analog Interface Processor," *I.E.E.E. 1987 Solid-State Circuits Conference*, Feb. 25, 1987, pp. 44-45, 333-334.

Brian Dance, "Chopper Stabilised Operational Amplifiers," *New Electronics*, vol. 20, No. 11, May 26, 1987, pp. 33-35.

Carl Jones et al., "Chopperstabilisierte Operationsverstärker—den Offset im Griff," *Elektronik*, vol. 20, Sep. 30, 1988, pp. 97-104.

European Search Report, dated May 31, 1990, for European Patent Application No. 89117361.9.

*Primary Examiner*—Eugene R. Laroche
*Assistant Examiner*—Tan Dinh
*Attorney, Agent, or Firm*—Thomas L. Peterson

[57] ABSTRACT

An offset-voltage-balancing operation amplifier for difference signals includes an auxiliary and a main amplifier, each having a difference input and an auto-zero input. To provide offset balancing, the auto-zero inputs are connected to the potentials of two integrated storage capacitors. The difference input of the auxiliary amplifier can be short-circuited via first and second switching means, and the two storage capacitors are connected to the output of the auxiliary amplifier via third and fourth switching means. The sensitivity of the auto-zero inputs is less than the sensitivity of the difference inputs.

12 Claims, 3 Drawing Sheets a) cl' b) p1' c) p2' d) p3' e) p4'

OFFSET-VOLTAGE-BALANCING OPERATIONAL AMPLIFIER

BACKGROUND OF THE INVENTION

1. Field of the Invention

The present invention is in the field of electronic circuits, and, more particularly, is in the field of circuits that correct the input offset voltage of an operational amplifier.

2. Description of the Related Art

During the processing of DC voltage signals or low-frequency signals, direct-coupled operational amplifiers, particularly operational amplifiers in MOS technology, generate an error caused by the input offset voltage. From the journal "Elektronik", No. 20, Sept. 30, 1988, pages 97 to 104, a method is known whereby this offset voltage can be nulled during operation with the aid of a main amplifier and an auxiliary amplifier. During regular measurement intervals, the auxiliary amplifier is disconnected from the input signal and short-circuited at the input end. The resulting output level of the auxiliary amplifier is stored by means of an external capacitor. During a second measurement interval, the auxiliary amplifier is connected to the input signal at the input end and to a second external capacitor at the output end. The potentials stored in the two external capacitors are applied to the two auto-zero inputs of the main and auxiliary amplifiers, so that during operation, the effect of offset voltage errors on the output of the main amplifier is compensated. A more detailed explanation of the operation of this prior art circuit is given below in connection with FIGS. 1 and 2.

SUMMARY OF THE INVENTION

An essential disadvantage of the prior art arrangement is the use of relatively large capacitors for storing the output signals from the auxiliary amplifier. Accordingly, the object of the invention as claimed is to provide a circuit arrangement for an offset-voltage-balancing operational amplifier whose storage capacitors are small, so that the entire arrangement is suitable for monolithic integration. The advantages of the invention follow direct from the manner in which the object is attained.

BRIEF DESCRIPTION OF THE DRAWINGS

The above and further features and advantages of the invention will become more apparent from the following description taken in conjunction with the accompanying drawings, in which.

DETAILED DESCRIPTION OF THE PREFERRED EMBODIMENT

Figure 1:
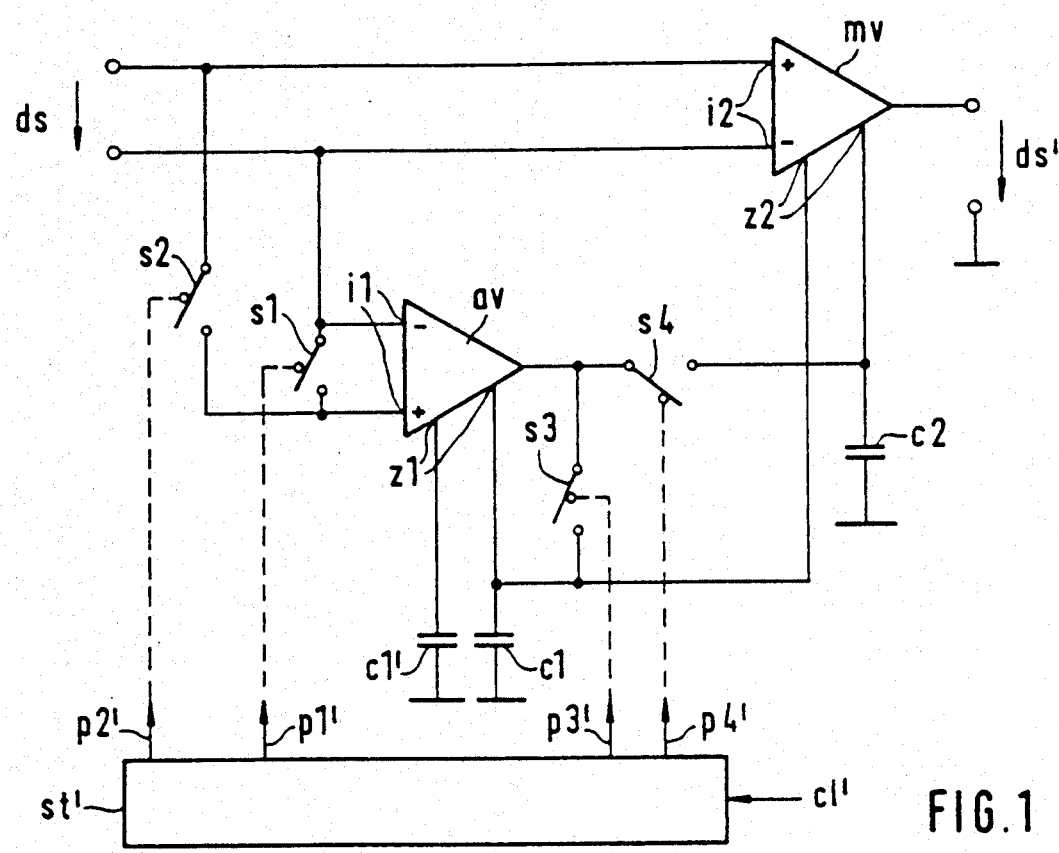
FIG. 1 is a block diagram of a prior art offset-voltage-balancing operational amplifier.
Figure 2:
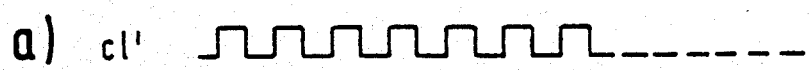
FIG. 2 is a timing diagram for the circuit of FIG. 1.
Figure 2:
Figure 2:
Figure 2:
Figure 2:

In the circuit arrangement of FIG. 1, a main amplifier mv is constantly connected to an input difference signal ds and to an output, so that unlike in conventional chopper amplifiers, only very small spikes occur in an output signal ds'. To provide offset-voltage balancing, an internal null (amplifier—namely an auxiliary amplifier av—adjusts first itself and then the main amplifier mv to zero. As illustrated in FIG. 2, the operation of the circuit in various time intervals (1) to (4) is as follows In the time interval (1), the auxiliary amplifier av is disconnected from the difference signal ds and short-circuited at its difference input il. To this end, a first switching means s1 is closed and a second switching means s2 is opened. The voltage at the output of the auxiliary amplifier av is thus determined solely by the amplifier's offset-voltage error.

In the time interval (2), after the transient recovery time of the auxiliary amplifier av, a third switching means s3 is closed to connect an external first storage capacitor c1 to the output of the auxiliary amplifier av. The potential of this first storage capacitor c1 and an auxiliary capacitor c1' is applied as a compensation voltage to an auto-zero input z1 of the auxiliary amplifier av. The two capacitors cl, cl' must hold the potential over the second half of the complete adjustment cycle. In the time interval (3), the first and third switching means s1, s3 are opened and the second switching means s2 is closed to connect the difference input il of the auxiliary amplifier to the difference signal ds. In this time interval, the output signal ds' from the main amplifier mv, whose difference input i2 is continuously fed with the difference signal ds, is still falsified by the offset voltage of this amplifier.

In the time interval (4), the compensation of the main amplifier mv takes place. At the beginning of this time interval, the output of the auxiliary amplifier av, which has its difference input connected to the difference signal ds, is in the steady state. A fourth switching means s4 is then closed to connect an external second storage capacitor c2 to the output of the auxiliary amplifier av. The potentials of the first and second storage capacitors, c1, c2 are applied as control signals to the auto-zero input z2 of the main amplifier mv over two leads, so that the offset voltage of the latter is nulled.

The foregoing assumes that the operational amplifier, and thus the main amplifier mv, has a very high open-loop gain, and that the two terminals for the difference signal ds are nearly at the same potential. This corresponds to the usual operation of operational amplifiers, to which strong negative DC voltage feedback is applied via the peripheral circuit.

The potential of the second storage capacitor c2 is thus dependent both on the offset voltage of the main amplifier mv and on the offset voltage of the auxiliary amplifier av. By applying the difference voltage of the first and second storage capacitors c1, c2 to the auto-zero input z2 of the main amplifier mv, the offset voltage of the latter is nulled except for a small remainder.

The switching means s1, s2, s3, s4 are controlled by four control signals p1', p2', p3', p4', which are derived from a clock signal cl' in a control circuit st'. The control signals must define at least two nonoverlapping time intervals, namely the first and second measurement intervals m1, m2 in the time intervals (2) and (4), respectively, as illustrated in FIG. 2.

Figure 3:
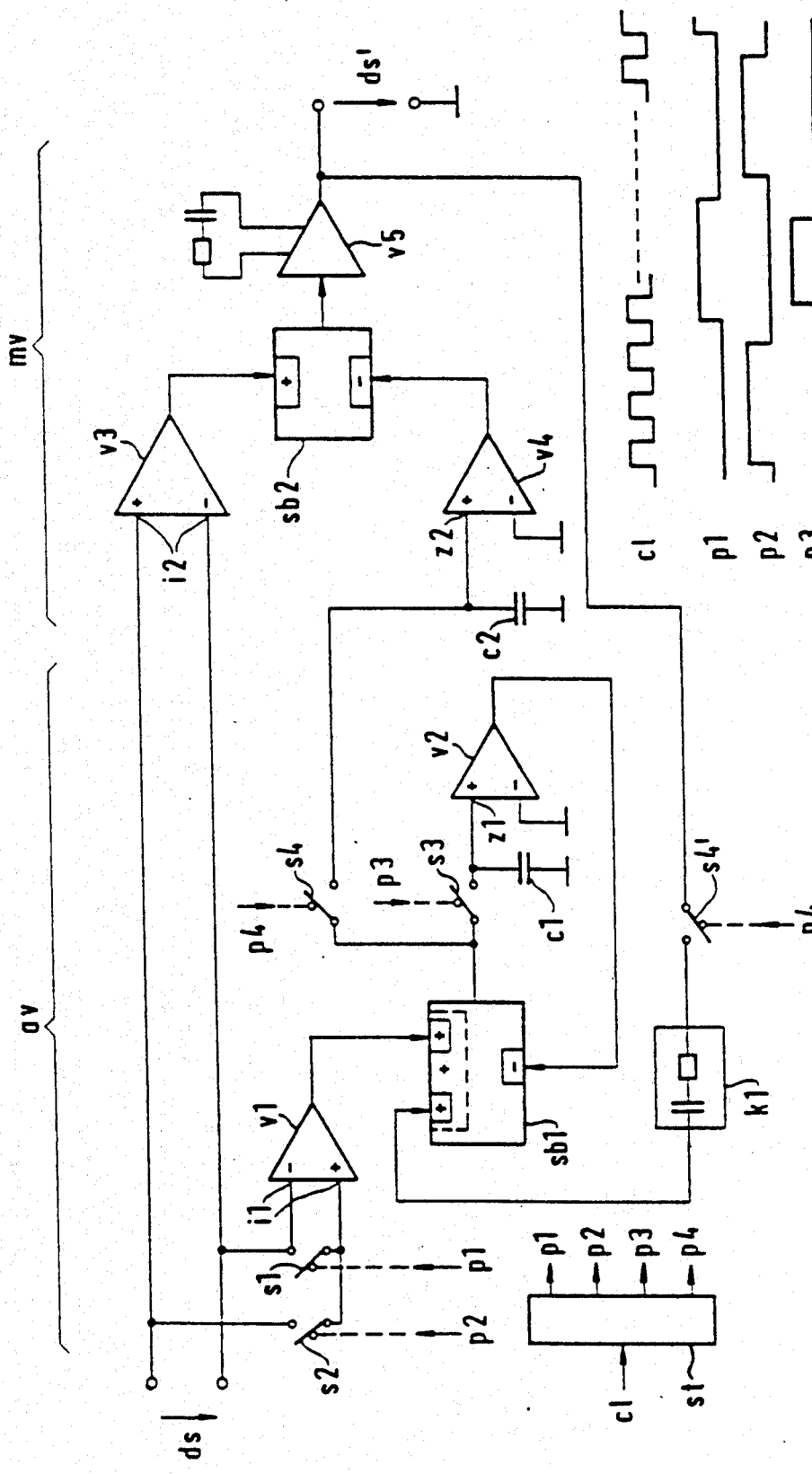
FIG. 3 is a block diagram of an operational amplifier in accordance with the invention.
Figure 4:
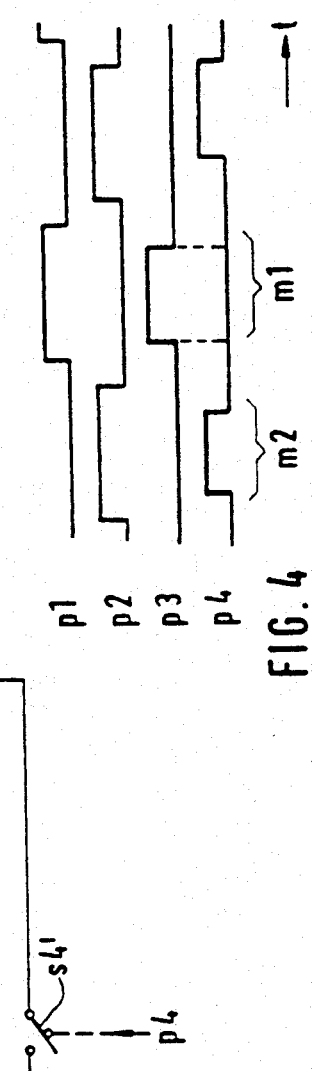
FIG. 4 is a timing diagram for the circuit of FIG. 3.

FIG. 3 shows an embodiment of an offset-voltage-balancing operational amplifier in accordance with the invention. Parts having the same functions as the corresponding parts in FIG. are designated by like reference characters. The auxiliary amplifier av is formed from first and second amplifiers v1, v2 and a first subtracter sb1.

The main amplifier mv is formed from third, fourth and fifth amplifiers v3, v4, v5 and a second subtracter sb2. The difference signal ds is applied to the inputs of the third amplifier v3. The output of the third amplifier v3 is applied to the minuend input of the second subtracter sb2.

The five amplifiers v1, v2, v3, v4, v5 can be implemented in bipolar or MOS technology. They may be current- or voltage-controlled. Irrespective thereof, the outputs may be designed as current or voltage sources.

The first amplifier v1 has a first predetermined sensitivity ("first sensitivity value") e1. In the case of voltage or current amplifiers, a defined finite gain corresponds to this predetermined sensitivity. The first amplifier v1 forms the difference input i1 of the auxiliary amplifier av. The second amplifier v2 has a second predetermined sensitivity ("second sensitivity value") e2 and forms the auto-zero input z1. The outputs of the first and second amplifiers v1, v2 are connected to the minuend and subtrahend inputs, respectively, of the first subtracter sb1, whose output is the auxiliary-amplifier output.

The output of the first subtracter sb1 is connected to the first storage capacitor c1 and to the input of the second amplifier v2 via the third switching means which is switched by a third control signal p3. The sensitivity value e2 of the second amplifier v2 is less than the sensitivity value e1 of the first amplifier v1 by at least a factor of 5, preferably by a factor of 100 to 200. Thus, in the first measurement interval m1, a voltage value appears across the first storage capacitor c1 which is greater by this factor of the difference in sensitivity. The output voltage of the second amplifier v2 is thus nearly unaffected by the offset voltage error of this amplifier. The essential advantage of this measure, however, lies in the fact that the necessary capacitance value of the first storage capacitor c1 can be very small, e.g., 10 to 60 picofarads, a value which can be realized without the capacitor taking up too much chip area.

The output of the first subtracter sb1 is also connected to the fourth switching means s4, which is controlled by a fourth control signal p4. The fourth switching means has its output coupled to the second storage capacitor c1 and to the input of the fourth amplifier v4. The fourth sensitivity value e4 of the fourth amplifier v4 is equal to the second sensitivity value e2. The third sensitivity value e3 of the third amplifier v3 is equal to the first sensitivity value e1. Thus, in the second measurement interval m2, a voltage appears across the second storage capacitor c2 which is greater by the factor of the difference between the third and fourth sensitivities e3, e4 than would be the case with equal sensitivity values. In the second amplifier v2, the offset voltage of the fourth amplifier v4 can thus be left out of account. Here, too, the essential advantage is that the second storage capacitor c2 needs to have a value of only 10 to 60 picofarads, so that it is well suited for monolithic integration.

The output of the fourth amplifier v4 feeds the subtrahend input of the second subtracter sb2. The output of the second subtracter sb2 feeds the input of the fifth amplifier v5, which provides the actual amplification of the operational amplifier through its high open-loop gain. To provide full negative feedback capability for the operational amplifier, the fifth amplifier v5 incorporates conventional 1/f frequency reduction, which is indicated in FIG. 3 by the RC section connected to the fifth amplifier v5. A separate circuit block represents the controller st, which provides the four control signals p1, p2, p4 for the four switching means s1, s2, s3, ®4 under control of the clock signal cl.

If the rate of change, and thus the frequency of the difference signal ds, is very small compared with the frequency of the complete measurement cycle, which is 1 kHz, for example, the control circuit described will cause the residual offset error to become very small.

The behavior is different if the difference signal ds changes its value during the second measurement interval m2. The external control loop, via the output of the main amplifier mv, then tries during the second measurement interval m2 to compensate the suspected offset error and provides an output signal ds' which differs from the correct output signal. The difference increases with the rate of change of the difference signal ds.

To remedy this, the output of the fifth amplifier v5 is fed back to a compensation input of the first subtracter sb1 via a compensation circuit k1. The compensation input is, for example, an additional minuend input with an adder in which the two minuend signals are added. Since the error occurs in the second measurement interval m2, the feedback path is completed only in the second measurement interval m2 by an additional fourth switching means s4', which is controlled by the fourth control signal p4. The compensation circuit k1 has a frequency response which is inverse to that of the fifth amplifier v5. This ensures that the compensation also works satisfactorily in the range of the 1/f frequency reduction of the operational amplifier.

Figures 5A, 5B:
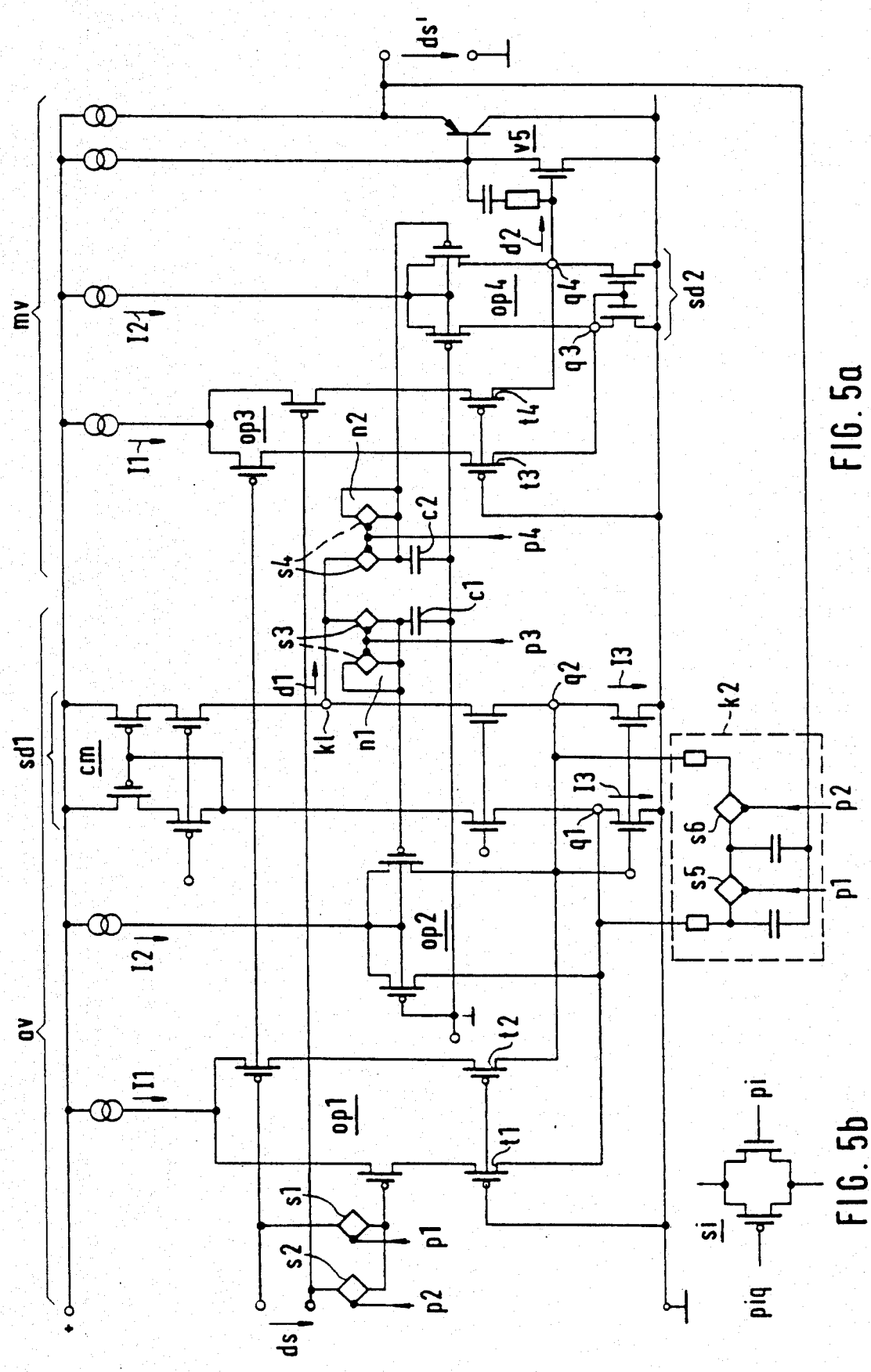
FIGS. 5a and 5b are schematic circuit diagrams of a further embodiment of the operational amplifier in accordance with the invention and of a switching means as used therein.

FIG. 5a is a circuit diagram of a further embodiment of the offset-voltage-balancing operational amplifier which is implemented using CMOS technology. The first, second, third and fourth amplifiers v1, v2, v3, v4 are designed in the form of first, second, third and fourth operational transconductance amplifiers ("OTA") op1, op2, op3, oP4, respectively. The difference outputs of the first and second OTA's op1, op2 are connected to first and second feed-in points q1, q2 of a first current-difference stage sd1, which acts as the first subtracter sb1.

The operation of the first current-difference stage sd1, which includes a cascode current mirror cm, is as follows. The input and output of the current mirror cm are fed with equal constant currents I3 via the first and second feed-in points q1, q2. At the feed-out point k1 between the second feed-in point qz and the output of the current mirror cm, a unipolar first difference current d1 can be tapped as the output signal of the current-difference stage sd1. If, besides the constant currents I3, no further, unequal currents are supplied to the two feed-in points q1, 12, the output current of the current mirror cm will be exactly equal to the current supplied through the second feed-in point q2. In that case, the value of the difference current d1 is zero. If, however, different currents are supplied to the two feed-in points q1, q2, their difference will appear at the feed-out point k1 as a unipolar first difference current d1.

In the main amplifier mv, the difference outputs of the third and fourth OTA's op3, op4 are connected to a third feed-in point q3 and a fourth feed-in point q4, respectively, of a second current-difference stage sd2, which acts as the second subtracter sb2 and delivers a second difference current d2. The fourth feed-in point q4 serves as the output terminal. The second difference current d2 drives the fifth amplifier v5, which provides the output signal ds'. All four OTA's include a p-channel differential amplifier in their inputs, and the output lines of the first and third OTA's op1, op3 contain additional p-channel transistors t1, t2 and t3, t4, respectively, in a cascode configuration. The second current-difference stage sd2 includes a simple current mirror consisting of two n-channel transistors, with the input and output of the current mirror connected to the third feed-in point q3 and the fourth feed-in point q4, respectively.

The smaller sensitivity values e2, e4 in the second and fourth OTA's op2, op4 are achieved by making the channel length of the p-channel transistor pair at the input end greater than in the first and third OTA's op1, op3. Furthermore, the current I2, with which the common source terminal of the p-channel transistor pair in the second and fourth OTA's op2, op4 is driven, is less, by about an order of magnitude, than the current I1 which is supplied to the common source terminal in the first and third OTA's op1, op3. The sensitivity values e2, e4 are also reduced by increasing the effective gate-to-source voltage of the p-channel transistor pair at the input end. To do this, it is advantageous to connect the well regions of these p-channel transistors to the substrate terminal.

The circuit in FIG. 5a includes six switching means s1, s2, s3, s4, s5 and s6. If the circuit is implemented using CMOS technology as shown in FIG. 5a, each of the switching means s1, s2, s3, s4, s5, s6 is constructed as illustrated by a switch Si in FIG. 5b. Each switch Si is a transmission gate with anti-phase control signals pi, piq.

The capacitive coupling of the third and fourth control signals p3, p4 into the first and second storage capacitors c1, c2 is compensated by first and second balancing circuits n1, n2, respectively. Each of the balancing circuits n1, n2 comprises a short length of line connected in parallel with the sense line from the respective storage capacitor c1, c2 and containing a balancing element in the form of a reactive third or fourth switching means, s3, s4, respectively. The latter are fed with the third and fourth control signals p3, p4, respectively.

The compensation circuit k2 in FIG. 5a includes two high-pass filters whose frequency response is inverse to the 1/f negative feedback around the fifth amplifier v5, and whose two outputs are connected to the first and second feed-in points q1, q2, respectively. The fifth and sixth switching means s5, s6 cause the compensation circuit k2 to act on the first difference current d1 only in the second measurement interval m2.

In the first measurement interval m1, the control circuit in the auxiliary amplifier av, i.e., the first difference current d1, causes the voltage across the first storage capacitor c1 to change until the offset-error-containing output current of the first OTA op1 is compensated by an opposite offset of the second OTA op2. In that case, the first difference current c1 becomes zero, and the voltage across the first storage capacitor c1 no longer changes. The control loop in the auxiliary amplifier av thus uses integral control action. In the second measurement interval m2, the necessary offset of the second OTA op2 is ensured by the voltage held in the first storage capacitor c1.

In the second measurement interval m2, the offset-error-containing output current of the third OTA op3 is compensated by a corresponding offset of the fourth OTA op4. The respective offset of the fourth OTA op4 is controlled by the voltage across the storage capacitor c2, which is changed by the first difference current d1 until the auxiliary amplifier av no longer detects a voltage difference at its difference input. Thus, this second control loop, too, uses integral control action.

What is claimed is:

1. An offset-voltage-balancing operational amplifier for a pair of difference input signals, comprising
an auxiliary amplifier having an auto-zero input, a difference input that receives said pair of difference input signals, and an output;
a first switch that selectively short-circuits said difference input of said auxiliary amplifier;
a second switch that selectively connects at least one of said pair of difference input signals to said difference input of said auxiliary amplifier, and selectively disconnects said at least one of said pair of difference input signals from said difference input of said auxiliary amplifier when said first switch short-circuits said difference input;
a main amplifier having a difference input that receives said pair of difference signals, an auto-zero input, and an output;
a third switch having an input connected to said output of said auxiliary amplifier, and having an output;
a first storage capacitor connected to said output of said third switch, said first storage capacitor being selectively coupled to said output of said auxiliary amplifier to be charged thereby, said first storage capacitor connected to said auto-zero input of said auxiliary amplifier to apply a voltage thereto;
a fourth switch having an input connected to said output of said auxiliary amplifier and having an output
a second storage capacitor connected to said output of said fourth switch, said second storage capacitor being selectively coupled to said output of said auxiliary amplifier to be charged thereby, said second storage capacitor connected to said auto-zero input of said main amplifier to apply a voltage thereto; and
a controller that provides respective first, second, third and fourth control signals to control said first, second, third and fourth switches, respectively, said control signals defining a first measurement interval in which said first switch short-circuits said difference inputs of said auxiliary amplifier, and a nonoverlapping second measurement interval in which said second switch provides said one of said pair of difference signals to said difference input of said auxiliary amplifier;
wherein:
said auxiliary amplifier comprises:
a first amplifier having a first predetermined sensitivity, said first amplifier having a difference input that forms said difference input of said auxiliary amplifier, and having an output;
a second amplifier having a second predetermined sensitivity, said second amplifier having an input that forms said auto-zero input of said auxiliary amplifier, and having an output, said second sensitivity of said second amplifier being less than said first sensitivity of said first amplifier; and
a first subtracter having a minuend input connected to said output of said first amplifier, having a subtrahend input connected to said output of said second amplifier, and having an output, said output forming said output of said auxiliary amplifier; and said main amplifier having a third predetermined sensitivity, said third amplifier having a difference input that forms the difference input of said main amplifier, and having an output;

a fourth amplifier having a fourth predetermined sensitivity, said fourth sensitivity less than said third sensitivity, said fourth amplifier having a fourth difference input that forms the auto-zero input of said main amplifier, and having an output;

a second subtracter having a minuend input connected to said output of said third amplifier, having a subtrahend input connected to said output of said fourth amplifier, and having an output; and a fifth amplifier having an input and an output, said input connected to said output of said second subtracter, said fifth amplifier having a high open-loop gain, said output of said fifth amplifier forming said output of said main amplifier.

2. The operational amplifier as defined in claim 1, wherein said first subtracter further includes a compensation input and wherein said fifth amplifier has a frequency response, said operational amplifier further comprising:

a compensation circuit having an input and an output, said output connected to said compensation input of said first subtracter, said compensation circuit having a frequency response which is inverse to said frequency response of said fifth amplifier; and a fifth switch having an input and an output, said input connected to said output of said fifth amplifier, said output connected to said compensation circuit, said fifth switch operable during said second measurement interval to complete a feedback path from said fifth amplifier to said first subtracter.

3. The operational amplifier as defined in claim 1, wherein said first, second, third, and fourth amplifiers comprise first, second, third, and fourth operational transconductance amplifiers, respectively, having said first, second, third and fourth sensitivities, respectively, said operational amplifier being integrated using MOS technology.

4. The operational amplifier as defined in claim 3, wherein:

said second and fourth sensitivities of said second and fourth operational transconductance amplifiers, respectively, are less than said sensitivities of said first and third operational transconductance amplifiers, respectively, by at least a factor of 5;

said first and third sensitivities of said first and third operational transconductance amplifiers are substantially equal, and said second and fourth sensitivities of said second and fourth operational transconductance amplifiers are substantially equal; and said first and second storage capacitors are constructed using monolithic integrated circuit techniques.

5. The operational amplifier as defined in claim 4, wherein said second and fourth sensitivities of said second and fourth operational transconductance amplifiers, respectively, are less than said sensitivities of said first and third operational transconductance amplifiers, respectively, by at least a factor of about the second power of ten.

6. The operational amplifier as defined in claim 4, wherein:

said first, second, third and fourth operational transconductance amplifiers have anti-phase current outputs;

said first subtracter comprises a first current-difference stage having first and second feed-in points connected to said anti-phase current outputs of said first and second operational transconductance amplifiers;

said second subtracter comprises a second current-difference stage having third and fourth feed-in points connected to said anti-phase current outputs of said third and fourth operational transconductance amplifiers; and said first current-difference stage and said second current-difference stage have respective first and second output terminals, which deliver a first difference current and a second difference current, respectively, as unipolar output currents.

7. The operational amplifier as defined in claim 6, wherein:

said fifth amplifier includes negative feedback that provides 1/f frequency reduction; and said compensation circuit comprises:

and second high-pass filters having a frequency response inverse to the 1/f negative feedback of said fifth amplifier, said first and second high-pass filters having respective outputs coupled to said first and second feed-in points of said first current-difference stage; and fifth and sixth switches controlled by said first and second control signals, respectively, to cause said compensation circuit to respond to said first difference current during said second measurement interval.

8. An operational amplifier as defined in claim 7, wherein said operational amplifier is implemented using CMOS technology, and wherein anti-phase control signals are U.T. applied to each of said first, second, third, fourth, fifth and sixth switches and to each of said first and second reactive switching means of said first and second balancing circuits.

9. An operational amplifier as defined in claim 6, wherein:

said first operational transconductance amplifier has difference output that comprises a first field-effect transistor and a second field-effect transistor in a cascode configuration;

said third operational transconductance amplifier has a difference output that comprises a third field-effect transistor and a fourth field-effect transistor in a cascode configuration; and said first current-difference stage comprises a current mirror in a cascode configuration.

10. The operational amplifier as defined in claim 4, further comprising:

a first balancing circuit, comprising a first reactive switching means fed with said third control signal, interposed between said first storage capacitor and said auto-zero input of said auxiliary amplifier; and a second balancing circuit, comprising a second reactive switching means fed with said fourth control signal, interposed between said second storage capacitor and said auto-zero input of said main amplifier.

11. An operational amplifier as defined in claim 10, wherein said operational amplifier is implemented using CMOS technology, and wherein said anti-phase control signals are applied to each of said first, second, third, fourth, fifth and sixth switches and to each of said first and second reactive switching means of said first and second balancing circuits.

12. The operational amplifier as defined in claim 4, wherein:

each of said first, second, third and fourth operational transconductance amplifiers has a respective constant-current source and has a field-effect transistor difference stage at its input end having a channel length and an effective gate-to-source voltage; and said sensitivity of each of said first, second, third and fourth operational transconductance amplifiers is adjusted via the channel length and the effective gate-to-source voltage of the respective field-effect transistor difference stage and via the value of the current delivered by the respective constant-current source.

* * * * *